US009035426B2

(12) United States Patent
Chang et al.

(10) Patent No.: US 9,035,426 B2
(45) Date of Patent: May 19, 2015

(54) FIN-LIKE BJT

(75) Inventors: Chih-Sheng Chang, Hsin-Chu (TW); Yi-Tang Lin, Hsin-Chu (TW); Ming-Feng Shieh, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 13/339,160

(22) Filed: Dec. 28, 2011

(65) Prior Publication Data

US 2013/0168819 A1 Jul. 4, 2013

(51) Int. Cl.

*H01L 29/70* (2006.01)
*H01L 29/06* (2006.01)
*H01L 29/08* (2006.01)
*H01L 29/417* (2006.01)
*H01L 29/735* (2006.01)

(52) U.S. Cl.

CPC ...... *H01L 29/41708* (2013.01); *H01L 29/0692* (2013.01); *H01L 29/0808* (2013.01); *H01L 29/0821* (2013.01); *H01L 29/735* (2013.01)

(58) Field of Classification Search

USPC .......................................... 257/565, 197, 592
See application file for complete search history.

(56) References Cited

U.S. PATENT DOCUMENTS

2006/0202306 A1* 9/2006 Agam et al. .................. 257/565
2007/0205487 A1* 9/2007 Ikeda ............................ 257/565
2008/0087918 A1* 4/2008 Arendt .......................... 257/197
2010/0187656 A1* 7/2010 Ke et al. ........................ 257/586
2012/0032303 A1* 2/2012 Elkareh et al. ................ 257/587

FOREIGN PATENT DOCUMENTS

KR 1020000032733 A 6/2000

OTHER PUBLICATIONS

Korean Notice of Allowance of Patent for KR 10-2012-0035102, mailed Mar. 28, 2013, 3 pages.

* cited by examiner

*Primary Examiner* — Thanh T Nguyen
(74) *Attorney, Agent, or Firm* — Slater & Matsil, L.L.P.

(57) ABSTRACT

A bipolar junction transistor (BJT) formed using a fin field-effect transistor (FinFET) complimentary metal-oxide-semiconductor (CMOS) process flow is provided. The BJT includes an emitter fin, a base fin, and a collector fin formed on a substrate. The base fin encloses the emitter fin and collector fin encloses the emitter fin. In some embodiments, the emitter fin, base fin, and collector fin have a square shape when viewed from above and are concentric with each other.

20 Claims, 9 Drawing Sheets

FIN-LIKE BJT

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density (the gate density (i.e., transistor count) in the same layout area compared to the traditional planar device) but also improve gate control of the channel. That is, FinFETs boost the performance and reduce leakage (power consumption) of individual transistor).

Bipolar junction transistors (BJTs) and FinFETs require different structures. Therefore, they are typically are fabricated using different fabrication processes.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a bipolar junction transistor (BJT) 10 formed using a fin field-effect transistor (FinFET) complimentary metal-oxide-semiconductor (CMOS) process flow. The BJT 10 is compatible to the current FinFET CMOS logic process flow. Therefore, no additional mask and process (meaning no additional cost) are needed for forming this fin-like BJT structure. The invention may also be applied, however, to other types of semiconductor device structures or circuits. (e.g., diode, resistor, well pickup, etc.)

Figures 1, 1A, 1B:
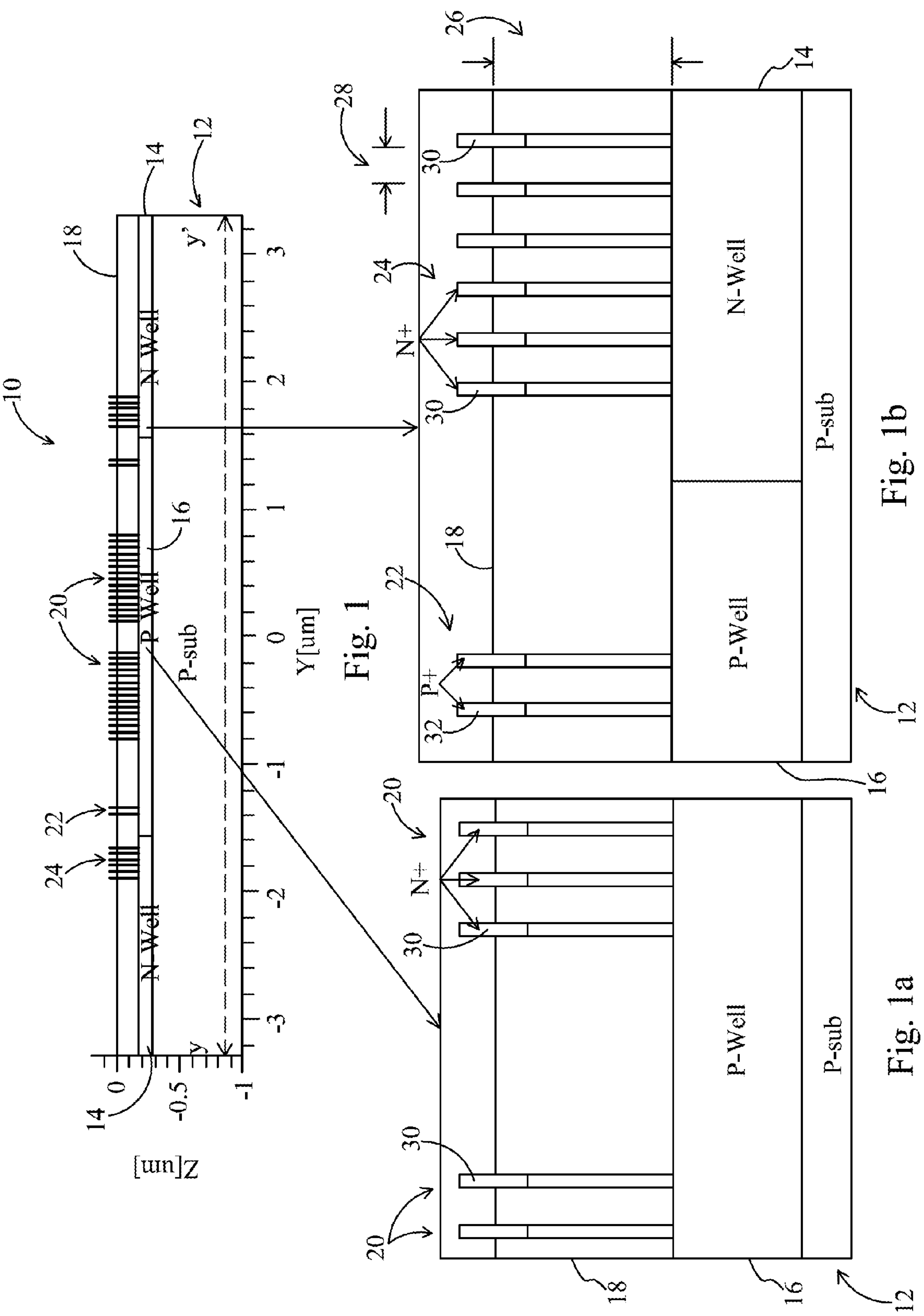
FIG. 1 is a cross section view, taken generally along y-y' in FIG. 2, of a bi-polar junction transistor (BJT) formed using a fin field-effect transistor (FinFET) complimentary metal-oxide-semiconductor (CMOS) process flow.
FIG. 1*a* is a portion of the BJT of FIG. 1 illustrating several emitter fins in further detail and schematically indicating the impurity doping condition for an n-p-n fin-like BJT.
FIG. 1*b* is a portion of the BJT of FIG. 1 illustrating base fins and collector fins in further detail and schematically indicating the impurity doping condition for the n-p-n fin-like BJT.

Referring now to FIG. 1, a BJT 10 formed using a fin field-effect transistor (FinFET) complimentary metal-oxide-semiconductor (CMOS) process flow is illustrated. In some embodiments, the BJT 10 includes a p-type doped semiconductor substrate 12 with n-wells 14 disposed on opposing sides of a p-well 16, shallow trench isolation (STI) regions 18, emitter fins 20, base fins 22, and collector fins 24. As will be clear from FIG. 2, n-well 14 may be a single, annular shaped region surrounding p-well 16. While an n-p-n BJT 10 is illustrated in FIG. 1, a p-n-p BJT or other semiconductor structures may also be formed.

In some embodiments, the substrate 12, the emitter fins 20, the base fins 22, and the collector fins 24 are formed from an insulator material to accommodate a silicon-on-insulator (SOI) FinFET processes as opposed to a bulk FinFET process where the substrate is generally formed from a silicon material.

In FIG. 1, a representative portion of the substrate 12 has a length of about six microns and an impurity concentration of about $10^{15}/cm^3$. In addition, the n-wells 14 have a depth or thickness of about 100 nm to about 400 nm, generally fully enclose the collector region, and have an impurity concentration of about $10^{18}/cm^3$. The p-well 16 has a depth or thickness of about 100 nm to about 400 nm, generally fully encloses the base and emitter regions, and has an impurity concentration of about $10^{18}/cm^3$. One skilled in the art will realize, however, that the dimensions and numerical values recited throughout the description are merely examples and will change if different formation technologies are used. In general, the doping level of the N+ and P+ regions (e.g., upper portion of the fins 20, 22, 24) are higher than that of the n-well 14 and the p-well 16. The doping level of the n-well 14 and p-well 16 are also higher than that of the substrate 12.

Referring now to FIGS. 1, 1*a*, and 1*b*, the STI regions 18 are formed over the substrate 12 and between each of the individual emitter, base, and collector fins 20, 22, 24. The STI regions 18 may be formed by etching the substrate 12 to form recesses and then filling the recesses with dielectric materials such as, for example, high-density plasma (HDP) oxide, TEOS oxide, or the like. In some embodiments, the depth 26 of the STI regions 18 is about 100 nm to 300 nm. In some embodiments, the depth of the STI regions 18 is much deeper than the effective fin height, which is the portion of the fins projecting above the top surface of STI region 18. In some embodiments, the effective fin height is about 15 nm to 100 nm. However, the effective fin height can be adjusted to reduce leakage, promote better overall performance of the device, and the like. In some embodiments, amount of space 28, which is occupied by the STI regions 18, between the emitter, base, and collector fins 20, 22, 24 is between about 30 nm to about 100 nm. In some embodiments, an STI layer covering the substrate is etched to form recesses that are then filled with an epitaxially grown semiconductor material to form the emitter, base, and collector fins 20, 22, 24.

Referring to FIG. 1*a*, in some embodiments an n-type impurity implantation is performed to form heavily doped n-type region 30 in an upper portion of the emitter fins 20 and the collector fins 24. Throughout the description, the term "heavily doped" indicates impurity concentrations of greater than about $10^{20}/cm^3$. However, it is appreciated that the term "heavily doped" is a term of art, and is related to the specific technology generation used for forming the integrated circuits of the embodiments. In some embodiments, a p-type impurity implantation is performed to form heavily doped p-type region 32 in an upper portion of the base fins 22. In some embodiments, in-situ doping may be performed to introduce impurities during the formation of the respective fins.

Figure 2:
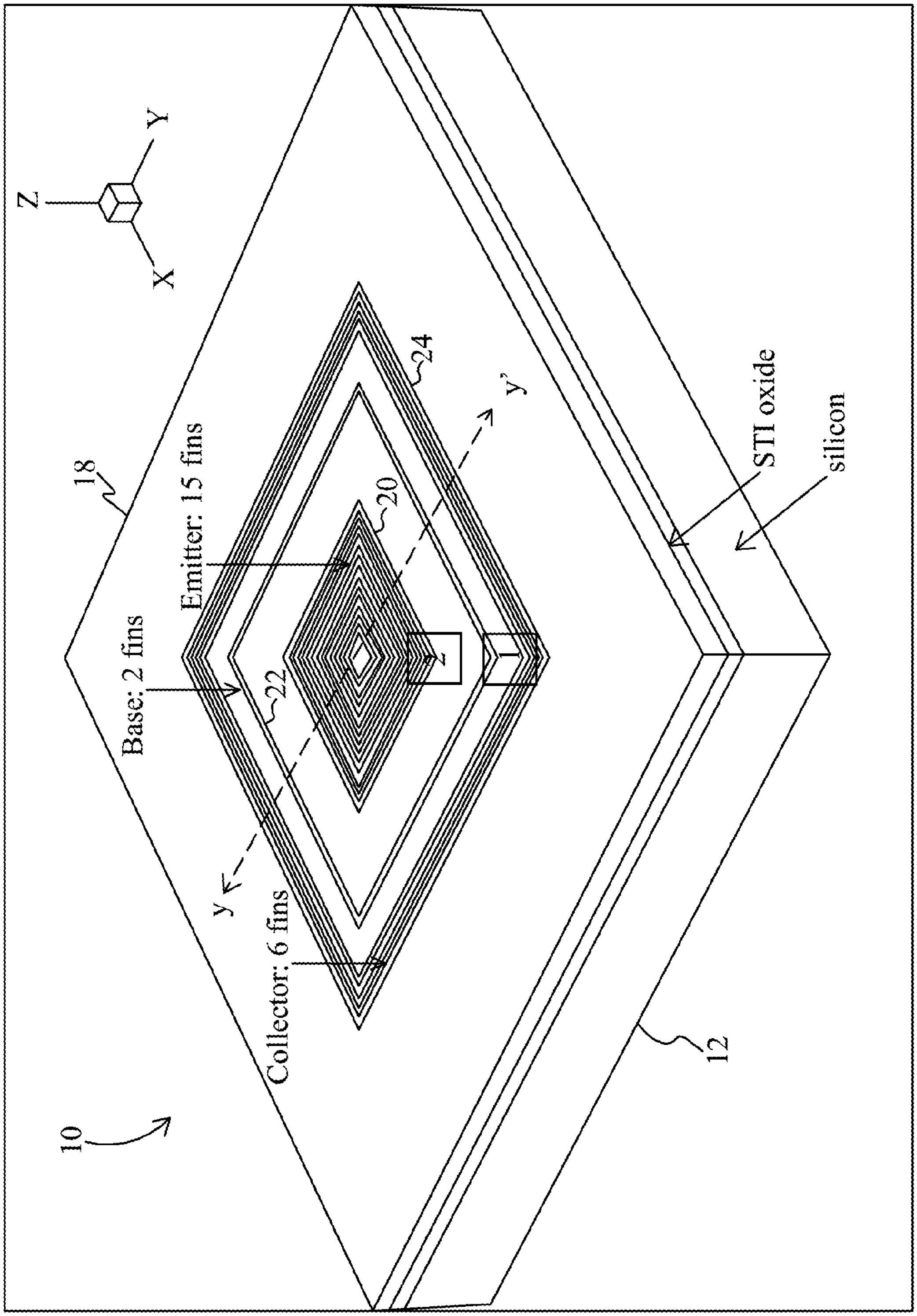
FIG. 2 is a perspective view of a fin-like BJT structure generally used for the BJT of FIG. 1 schematically indicating a semiconductor material (e.g., silicon, germanium, Gallium-Arsenic) for fins and substrate and an insulator material (e.g., silicon-dioxide) for isolation.

Referring to FIG. 2, each of the emitter fins 20, the base fins 22, and the collector fins 24 has a square shape when viewed from above. In some embodiments the emitter fins 20, the base fins 22, and the collector fins 24 may be formed in or represent other geometrical shapes (e.g., a rectangle, circle, etc.). The emitter fins 20, the base fins 22, and the collector fins 24 may also be formed in or represent irregular geometrical shapes. As shown in FIG. 2, each of the emitter fins 20 is concentric with the other emitter fins, each of the base fins 22 is concentric with the other base fins, and each of the collector fins 24 is concentric with the other collector fins. As such, the groups of emitter fins 20, the base fins 22, and the collector fins 24 are also concentric with each other. In FIG. 2, the base fins 22 surround the emitter fins 20 and the collector fins 24 surround both the base fins 22 and the emitter fins 20.

Still referring to FIG. 2, fifteen emitter fins 20, two base fins 22, and six collector fins 24 are illustrated. In some embodiments, more or fewer of the emitter fins 20, the base fins 22, and the collector fins 24 may be formed on the BJT 10. Indeed, in some embodiments the BJT 10 includes only a single emitter fin 20, a single base fin 22, and/or a single collector fin 24.

Figure 3:
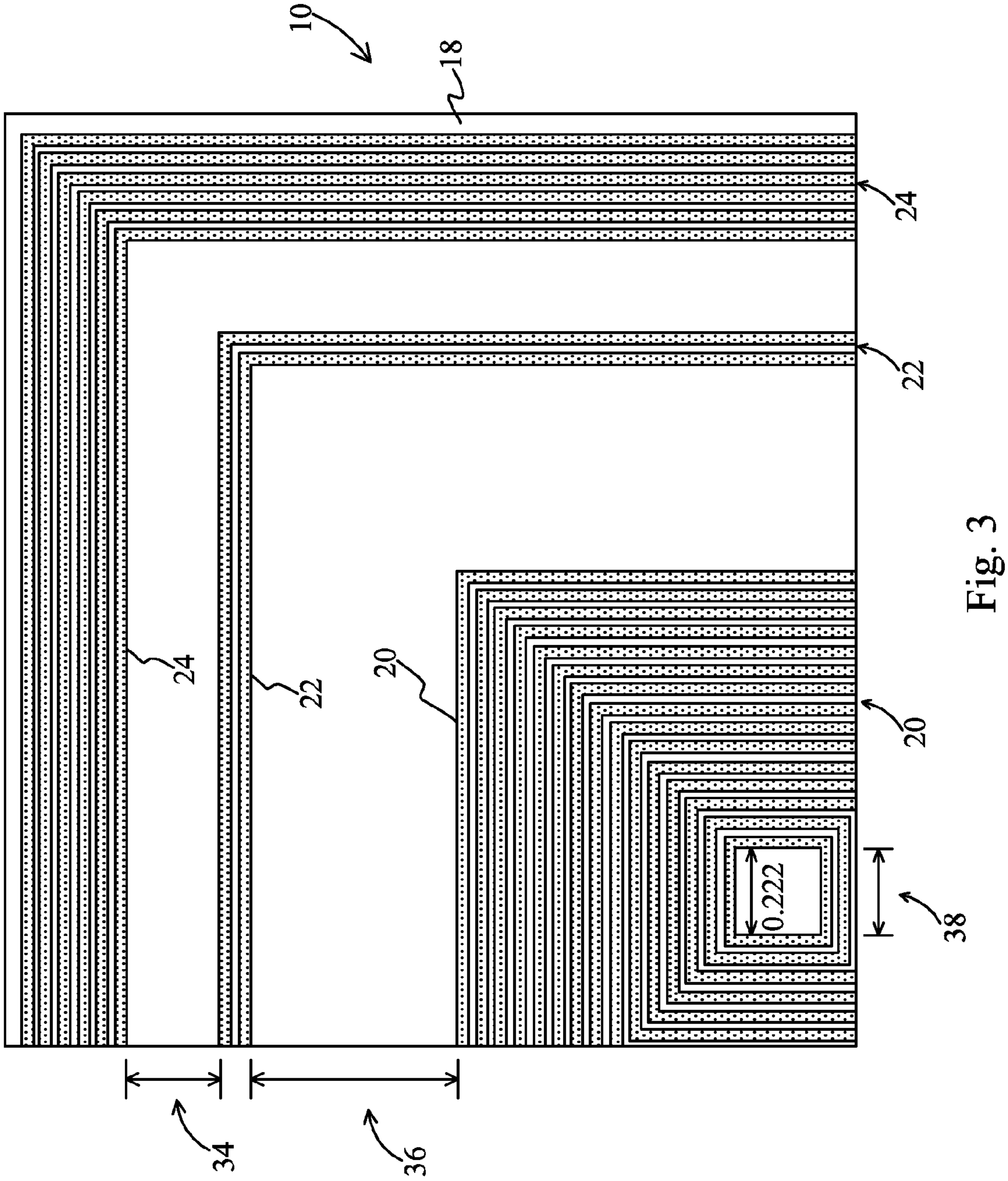
FIG. 3 is one embodiment of fin-like BJT layout or a plan view of a portion of the BJT of FIG. 2 illustrating the emitter, base, and collector regions in the BJT and the spacing between the emitter and base fins and the base fins and collector fins.

Moving to FIG. 3, a portion of the BJT 10 is represented as viewed from above. In some embodiments, a distance 34 between the innermost collector fin 24 and the outermost base fin 22 (i.e., the distance between the collector and base) is about 200 nm to about 500 nm. In some embodiments, a distance 36 between the innermost base fin 22 and the outermost emitter fin 20 (i.e., the distance between the base and emitter) is about 500 nm. Also, a distance 38 between opposing inner walls of the smallest emitter fin 20 is about 200 nm, depending on the lithography technology used.

Figure 4:
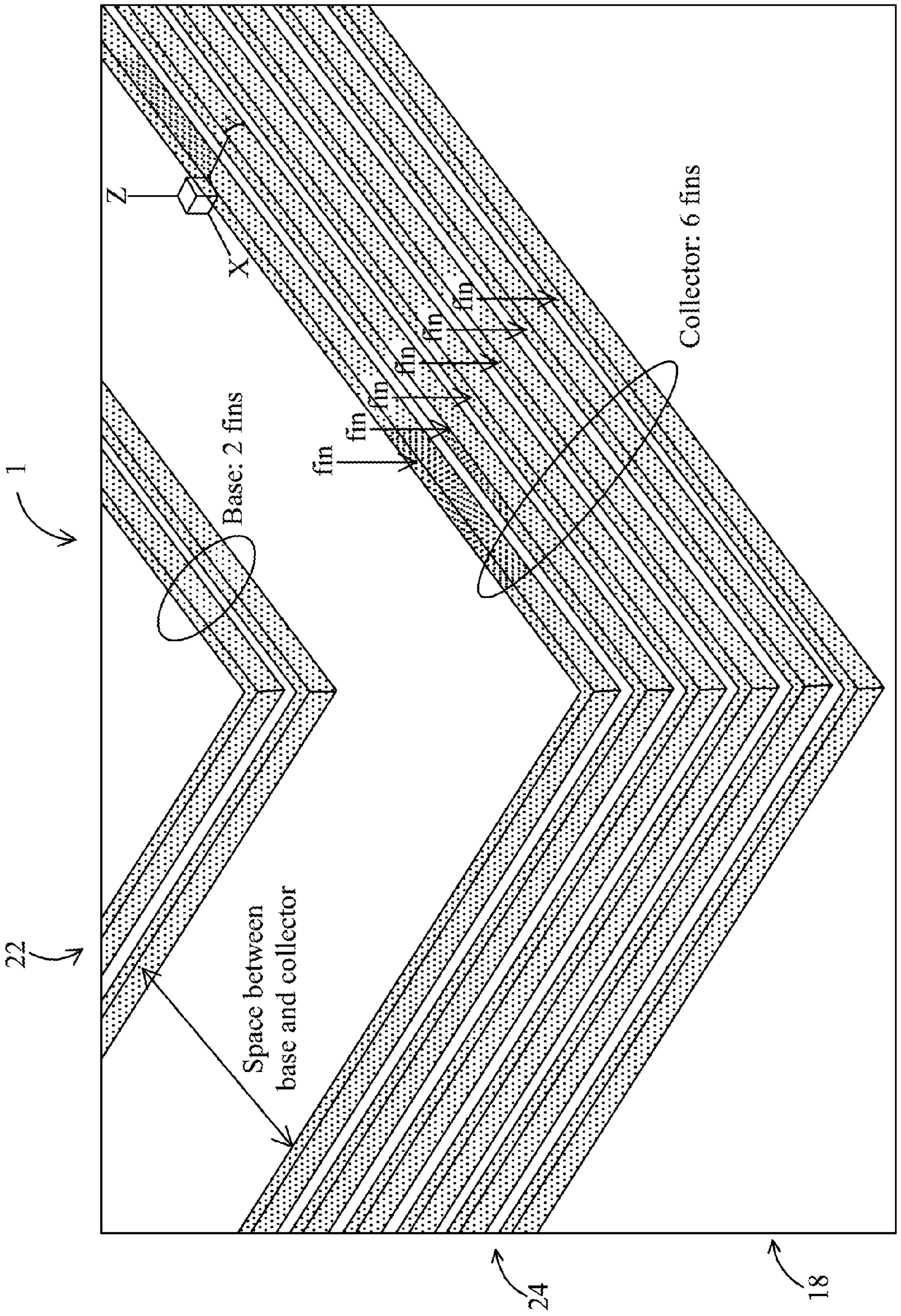
FIG. 4 is a perspective view of a portion of the collector and base fins from the BJT of FIG. 2.
Figure 5:
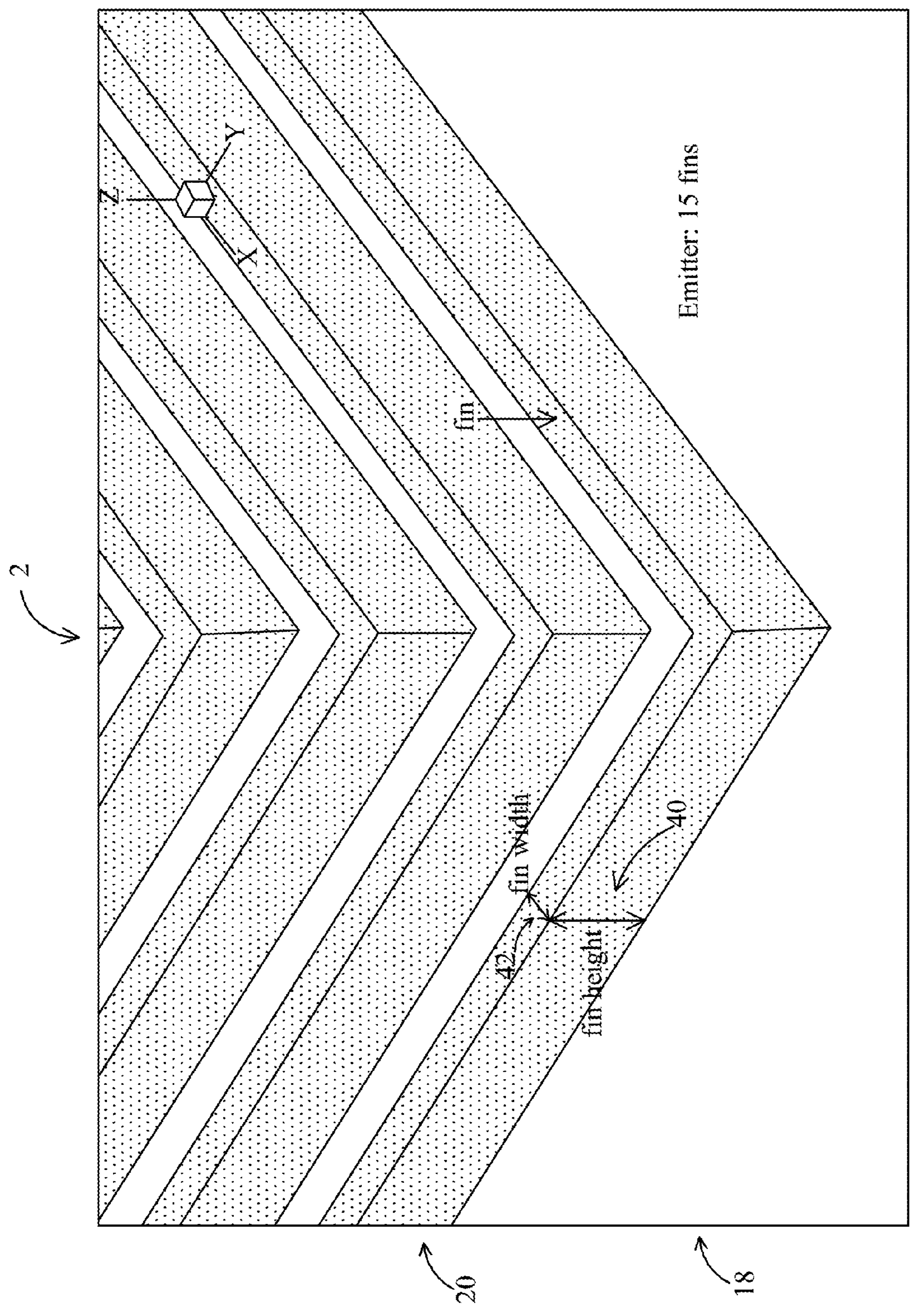
FIG. 5 is a perspective view of a portion of the BJT of FIG. 4 illustrating dimensions of the collector fins (e.g., fin height and fin width)

Referring now to FIG. 4, a portion of the BJT 10 has been magnified to further illustrate the base fins 22 and collector fins 24. The emitter fins 20 have been magnified in FIG. 5 for the purpose of illustrating that a height 40 of the collector emitter fins 20 is between about 20 nm to about 100 nm and a width 42 of the emitter fins 20 is between about 10 nm to about 15 nm. In some embodiments, the width of fins is about 10 nm for a "Fin" FET device and about 100 nm for a "tri-gated" FET device.

Figures 6, 6A, 6B:
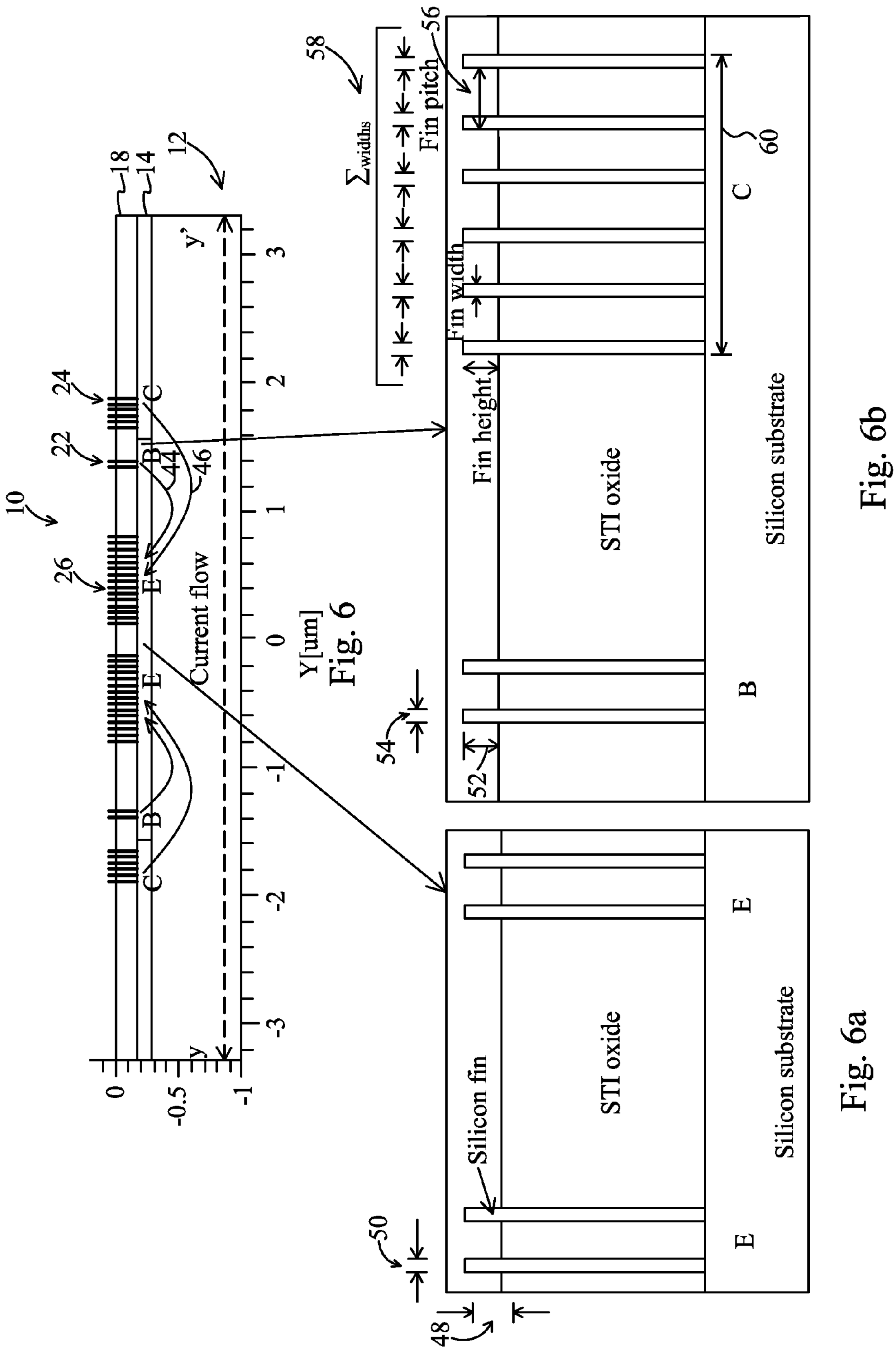
FIG. 6 is an elevation view of the BJT of FIG. 1 illustrating a current flow through the device and schematically indicating the semiconductor material (e.g., silicon, germanium, Gallium-Arsenic) for fin and substrate and the insulator material (e.g., silicon-dioxide) for isolation.
FIG. 6*a* is a portion of the BJT of FIG. 6 illustrating dimensions of the emitter fins.
FIG. 6*b* is a portion of the BJT of FIG. 6 illustrating dimensions of the base fins and the collector fins.

Referring now to FIG. 6, a representative current flow through the BJT 10 is illustrated. In particular, current 44 flows from the base fins 22 to the emitter fins 20 and a larger current 46, relative to the current 44, flows from the collector fins 24 to the emitter fins 20. As shown in FIGS. 6*a*-6*b*, a height 48 of the emitter fins 20 is between about 20 nm to about 100 nm and a width 50 of the emitter fins 20 is between about 10 nm to about 100 nm. Likewise, a height 52 of the base fins 22 is between about 20 nm to about 100 nm and a width 54 of the base fins 22 is between about 10 nm to about 15 nm. As shown in FIGS. 6*a*-6*b*, a fin pitch 56 (e.g., one fin's width plus the space between adjacent fins) for adjacent collector fins 24 is between about 40 nm to about 200 nm, depending on lithography, process limitations, and device structure design. In some embodiments, the fin pitch 56 between adjacent base fins 22 and adjacent collector fins 24 is also between about 40 nm to about 65 nm. In some embodiments, the fins 20-24 of the BJT 10 may be formed from a wafer having, for example, a 100, 111, or 110 crystal orientation.

With reference to FIGS. 6*a*-6*b*, a ratio of effective fin junction area 58 (which is the sum of the width of the fins times a length of the fins going into the page) to planar junction area 60 (which is the total width of the fins and STI material times the same length of the fins going into the page) on the BJT 10 is approximately Wfin*#fin*Length/[(#fin−1)*Pfin+Wfin]*Length where Wfin is the width a fin (e.g., width 42), #fin is the overall number of fins in the layout area, and Pfin is the pitch between fins (e.g., fin pitch 56). Those skilled in the art will recognize that the effective junction area of the BJT 10 is smaller than its planar BJT counterpart within the same layout area.

Figure 7:
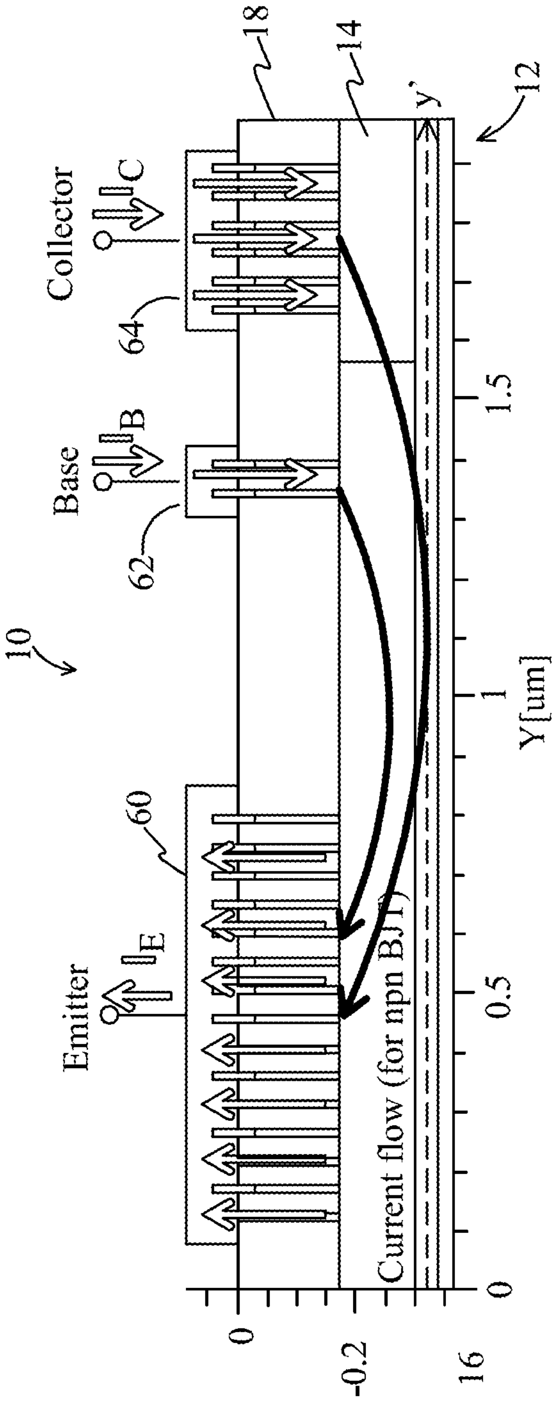
FIG. 7 is an elevation view of the BJT with the emitter fins electrically coupled together, the base fins electrically coupled together, and the collector fins electrically coupled together.
Figure 8:
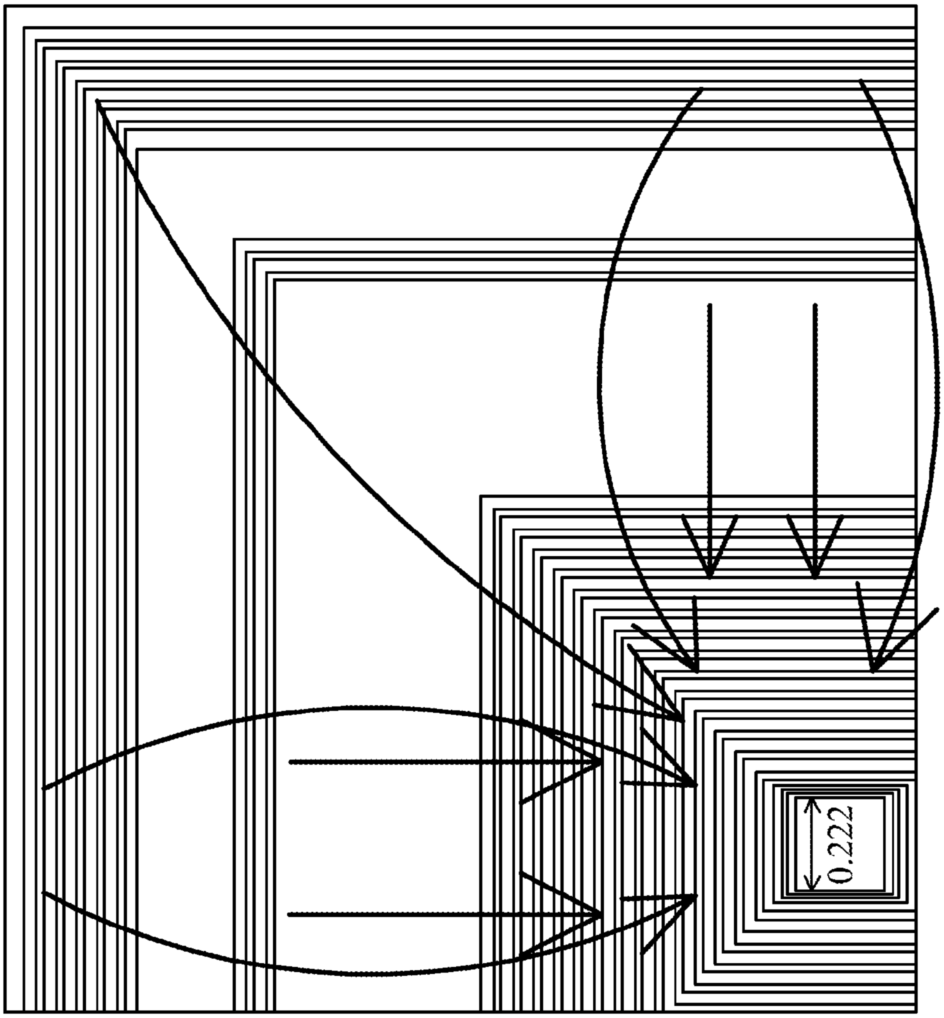
FIG. 8 is top view of a portion of the BJT of FIG. 7 illustrating a flow of current.

Referring now to FIG. 7, where a portion of the BJT 10 is illustrated, the emitter fins 20 have been electrically coupled together by a contact 60, the base fins 22 have been electrically coupled together by a contact 62, and the collector fins 24 have been electrically coupled together by a contact 64. In some embodiments, the contacts 60, 62, 64 are an epitaxially formed silicon or silicon-germanium. In some embodiments, the contacts 60, 62, 64 are metal zero (MO), copper, or tungsten plugs. As shown in FIG. 8, the "ring-like" structure of the emitter, base, and collector fins 24 provides an improved symmetry and current spreading relative to other known BJT devices.

Figure 9:
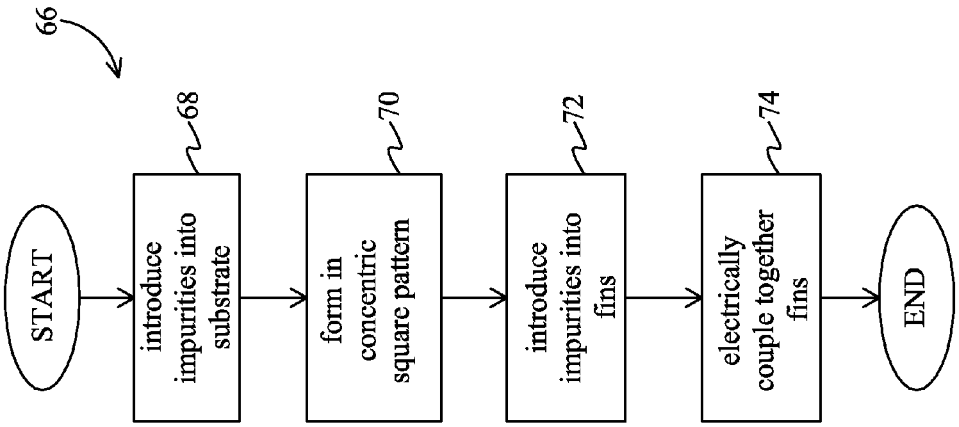
FIG. 9 is a flowchart illustrating a process of, or flow for, forming the BJT of FIG. 1 in some embodiments.

Referring now to FIG. 9, a process 66 of forming the BJT 10 depicted in FIG. 7 is illustrated. In block 68, impurities are introduced into the p-doped semiconductor substrate 12 to form the n-wells 14 and the p-well. In block 70, the emitter fins 20, base fins 22, and collector fins 24 are formed on the substrate in a concentric square pattern. As noted above, the fins 20, 22, 24 may be formed either by etching the substrate 12 and filling the recesses with STI oxide 18 or etching a layer of STI oxide 18 and epitaxially growing fins in the recesses. In block 72, impurities are introduced into the emitter fins 20, base fins 22, and collector fins 24. Such doping may be accomplished through an implantation or in-situ process. Thereafter, in block 74 the emitter fins 20 are electrically coupled together, the base fins 22 are electrically coupled together, and the collector fins 24 are electrically coupled together.

A bipolar junction transistor (BJT) comprises an emitter fin formed on a substrate, a base fin formed on the substrate, the base fin surrounding the emitter fin, and a collector fin formed on the substrate, the collector fin surrounding the base fin to form the BJT.

A bipolar junction transistor (BJT) comprises a plurality of concentric emitter fins formed on a substrate, a plurality of concentric base fins formed on the substrate, the plurality of base fins surrounding the plurality of concentric emitter fins, and a plurality of concentric collector fins formed on the substrate, the plurality of concentric collector fins surrounding plurality of concentric base fins to form the BJT.

A method of forming a bipolar junction transistor (BJT) comprises forming a plurality of concentric emitter fins on a substrate, forming a plurality of concentric base fins on the substrate, the plurality of base fins surrounding the plurality of concentric emitter fins, and forming a plurality of concentric collector fins on the substrate, the plurality of concentric collector fins surrounding plurality of concentric base fins to form the BJT.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A bipolar junction transistor (BJT), comprising:

an emitter fin formed on a substrate, the emitter fin enclosing an interior region of the substrate;

a base fin formed on the substrate, the base fin surrounding the emitter fin; and a collector fin formed on the substrate, the collector fin surrounding the base fin to form the BJT;

wherein a top portion of each of the emitter fin, the base fin, and the collector fin projects above a top surface of a shallow trench isolation (STI) region, the top portion of each of the emitter fin, the base fin, and the collector fin being formed of a doped semiconductor material, and wherein an entire area of the interior region is completely covered by the STI region.

2. The BJT of claim 1, wherein the emitter fin, the base fin, and the collector fin each have at least one of a square shape and a circular shape when viewed from above.

3. The BJT of claim 1, wherein the emitter fin, the base fin, and the collector fin are concentric.

4. The BJT of claim 1, wherein the emitter fin, the base fin, and the collector fin comprise an insulator material.

5. The BJT of claim 1, wherein the shallow trench isolation (STI) region is disposed between the emitter fin, the base fin, and the emitter fin.

6. The BJT of claim 1, wherein the emitter fin is formed from an n+ doped semiconductor material above a p-doped semiconductor material, the base fin is formed from a p+ doped semiconductor material above the p-doped semiconductor material, and the collector fin is formed from the n+ doped semiconductor material above an n-doped semiconductor material.

7. The BJT of claim 1, wherein the substrate is a p-doped silicon with a p-well and an n-well, the p-well disposed beneath each of the emitter fin and the base fin and the n-well disposed beneath the collector fin.

8. The BJT of claim 1, wherein the emitter fin is spaced apart from the base fin further than the base fin is spaced apart from the collector fin.

9. A bipolar junction transistor (BJT), comprising:

a plurality of concentric emitter fins formed on a substrate;

a plurality of concentric base fins formed on the substrate, the plurality of base fins surrounding the plurality of concentric emitter fins, wherein all of the concentric emitter fins are surrounded by an innermost concentric base fin of the plurality of concentric base fins; and a plurality of concentric collector fins formed on the substrate, the plurality of concentric collector fins surrounding plurality of concentric base fins to form the BJT;

wherein a top portion of each of the plurality of concentric emitter fins, the plurality of concentric base fins, and the plurality of concentric collector fins projects above a top surface of a shallow trench isolation (STI) region, the top portion of each of the plurality of concentric emitter fins, the plurality of concentric base fins, and the plurality of concentric collector fins being formed of a doped semiconductor material.

10. The BJT of claim 9, wherein the plurality of concentric emitter fins is formed from fifteen spaced-apart semiconductor fins.

11. The BJT of claim 9, wherein the plurality of concentric base fins is formed from two spaced-apart semiconductor fins.

12. The BJT of claim 9, wherein the plurality of concentric collector fins is formed from six spaced-apart semiconductor fins.

13. The BJT of claim 9, wherein the plurality of concentric emitter fins, plurality of concentric base fins, and plurality of concentric collector fins have a square shape when viewed from above.

14. The BJT of claim 9, wherein a shallow trench isolation (STI) region is disposed between the plurality of concentric emitter fins, the plurality of concentric base fins, and the plurality of concentric collector fins.

15. The BJT of claim 9, wherein the plurality of concentric emitter fins is formed from an n+ doped semiconductor material above a p-doped semiconductor material, the plurality of concentric base fins is formed from a p+ doped semiconductor material above the p-doped semiconductor material, and the plurality of concentric collector fins is formed from the n+ doped semiconductor material above an n-doped semiconductor material.

16. The BJT of claim 9, wherein the plurality of concentric emitter fins is electrically coupled together, the plurality of concentric base fins is electrically coupled together, and the plurality of concentric collector fins is electrically coupled together.

17. The BJT of claim 9, wherein the plurality of concentric emitter fins, the plurality of concentric base fins, and the plurality of concentric collector fins comprise an insulator material.

18. A bipolar junction transistor (BJT), comprising:

an emitter fin formed on a substrate;

a base fin formed on the substrate, the base fin surrounding the emitter fin; and a collector fin formed on the substrate, the collector fin surrounding the base fin to form the BJT;

wherein the emitter fin, the base fin, and the collector fin are concentric, a shallow trench isolation (STI) region is disposed between the emitter fin, the base fin, and the collector fin; and a top portion of each of the emitter fin, the base fin, and the collector fin projects above a top surface of the STI region, the top portion of each of the emitter fin, the base fin, and the collector fin being formed of a semiconductor material, and wherein an entire area of the substrate enclosed between the base fin and a neighboring base fin is completely covered by the STI region.

19. The BJT of claim 18, wherein the emitter fin, the base fin, and the collector fin have a square shape when viewed from above.

20. The BJT of claim 19, wherein the substrate is a p-doped silicon with a p-well and an n-well, the p-well disposed beneath each of the emitter fin and the base fin and the n-well disposed beneath the collector fin.

* * * * *